US009488697B2

(12) United States Patent
Harman (10) Patent No.: US 9,488,697 B2
(45) Date of Patent: Nov. 8, 2016

(54) FRACTIONAL DEPLETION ESTIMATION FOR BATTERY CONDITION METRICS

(71) Applicant: Crown Equipment Corporation, New Bremen, OH (US)

(72) Inventor: John R. Harman, Versailles, OH (US)

(73) Assignee: Crown Equipment Corporation, New Bremen, OH (US)

( * ) Notice: Subject to any disclaimer, the term of this patent is extended or adjusted under 35 U.S.C. 154(b) by 168 days.

(21) Appl. No.: 14/208,214

(22) Filed: Mar. 13, 2014

(65) Prior Publication Data

US 2014/0266227 A1 Sep. 18, 2014

Related U.S. Application Data

(60) Provisional application No. 61/792,907, filed on Mar. 15, 2013.

(51) Int. Cl.
*G01R 31/36* (2006.01)
*H01M 10/42* (2006.01)
(Continued)

(52) U.S. Cl.
CPC ......... *G01R 31/3679* (2013.01); *B60L 3/0046* (2013.01); *B60L 3/04* (2013.01); *B60L 3/12* (2013.01); *B60L 11/1857* (2013.01); *B60L 11/1861* (2013.01); *H01M 10/425* (2013.01); *H01M 10/48* (2013.01); *B60L 2200/36* (2013.01); *B60L 2200/42* (2013.01);
(Continued)

(58) Field of Classification Search
CPC .................................................. G01R 31/3679
USPC ........................................................ 324/427
See application file for complete search history.

(56) References Cited

U.S. PATENT DOCUMENTS 5,140,310 A * 8/1992 DeLuca ................. G08B 5/229
320/136
5,656,919 A * 8/1997 Proctor .............. G01R 31/3606
320/153

(Continued)

FOREIGN PATENT DOCUMENTS

DE 19540827 A1 5/1996
DE 000019540827 A1 5/1996

(Continued)

OTHER PUBLICATIONS

Maric, Viktor; International Search Report and Written Opinion of the International Searching Authority; International Application No. PCT/US2014/025528; Jun. 10, 2014; European Patent Office; Rijswijk, Netherlands.

(Continued)

*Primary Examiner* — Drew A Dunn
*Assistant Examiner* — Jerry D Robbins
(74) *Attorney, Agent, or Firm* — Stevens & Showalter LLP (57) ABSTRACT

Evaluation of a battery state comprises transforming a time based history of the load on the battery into a spectral representation of that history in a load domain, e.g., the current domain. The method also comprises comparing the spectral representation to an expected battery capability for the load represented by each line in the spectra and calculating the fraction of the expected capability used at each spectral line. The method still further comprises aggregating the calculated fractions into a total fraction that represents the estimated fraction of the expected battery capability associated with that particular time history.

15 Claims, 7 Drawing Sheets

(51) Int. Cl.
*H01M 10/48* (2006.01)
*B60L 3/00* (2006.01)
*B60L 3/04* (2006.01)
*B60L 3/12* (2006.01)
*B60L 11/18* (2006.01)

(52) U.S. Cl.
CPC ..... *B60L2240/545* (2013.01); *B60L 2240/547* (2013.01); *B60L 2240/549* (2013.01); *B60L 2240/70* (2013.01); *B60L 2240/80* (2013.01); *B60L 2250/10* (2013.01); *B60L 2260/44* (2013.01); *G01R 31/3613* (2013.01); *G01R 31/3651* (2013.01); *G01R 31/3689* (2013.01); *H01M 2010/4271* (2013.01); *H01M 2010/4278* (2013.01); *Y02T 10/7005* (2013.01); *Y02T 10/705* (2013.01); *Y02T 10/7016* (2013.01); *Y02T 10/7044* (2013.01); *Y02T 10/7291* (2013.01); *Y02T 90/16* (2013.01)

(56) References Cited

U.S. PATENT DOCUMENTS

| | | | |
|---|---|---|---|
| 6,362,601 | B1 | 3/2002 | Finger |
| 6,556,020 | B1 | 4/2003 | McCabe et al. |
| 6,668,247 | B2 | 12/2003 | Singh et al. |
| 6,804,626 | B2* | 10/2004 | Manegold ................ G08G 1/20 702/182 |
| 7,072,871 | B1* | 7/2006 | Tinnemeyer ....... G01R 31/3651 320/132 |
| 7,446,510 | B2 | 11/2008 | Chou et al. |
| 7,498,772 | B2 | 3/2009 | Palladino |
| 7,872,449 | B2 | 1/2011 | Gutlein |
| 8,116,998 | B2 | 2/2012 | Hess |
| 8,159,189 | B2 | 4/2012 | Zhang |
| 8,315,829 | B2 | 11/2012 | Zhang |
| 2003/0184307 | A1 | 10/2003 | Kozlowski et al. |
| 2005/0017685 | A1 | 1/2005 | Rees et al. |
| 2006/0284617 | A1 | 12/2006 | Kozlowski et al. |
| 2007/0046261 | A1 | 3/2007 | Porebski |
| 2008/0009003 | A1* | 1/2008 | Tartakoff ............. C12Q 1/6809 435/5 |
| 2008/0154712 | A1* | 6/2008 | Wellman .............. G05D 1/0282 235/384 |
| 2008/0186028 | A1 | 8/2008 | Jones et al. |
| 2010/0121588 | A1 | 5/2010 | Elder et al. |
| 2010/0198536 | A1 | 8/2010 | Hess |
| 2011/0040440 | A1* | 2/2011 | de Oliveira ............ G06Q 10/06 701/29.5 |
| 2011/0106280 | A1 | 5/2011 | Zeier |
| 2011/0148424 | A1 | 6/2011 | Chiang et al. |
| 2011/0258838 | A1 | 10/2011 | McCabe et al. |
| 2012/0038473 | A1 | 2/2012 | Fecher |
| 2013/0158755 | A1* | 6/2013 | Tang .................... H01M 10/48 701/22 |

FOREIGN PATENT DOCUMENTS

| | | |
|---|---|---|
| DE | 102009024422 A1 | 1/2011 |
| EP | 1450173 A2 | 8/2004 |
| EP | 14501732 A2 | 8/2004 |

OTHER PUBLICATIONS

Hopwood, Stephen; International Preliminary Report on Patentability; International Application No. PCT/US2014/025528; Mar. 17, 2015; European Patent Office; Rijswijk, Netherlands.

Miller, Mike; "The Secret Life of Batteries—A Breakthrough in Battery Monitoring Technology is Delivering Major Benefits Across the Electric Vehicle Industry, From Battery Manufacturers and Vehicle OEMs to the End Users", iVTInternational.com; Nov. 2012.

EnerSys; "Wireless Battery Monitoring Devices Wi-IQ® / Wi-IQ®2"; Mar. 2012.

Juang, Larry W.; "Online Battery Monitoring for State-of-Charge and Power Capability Prediction", Master of Science (Electrical Engineering), University of Wisconsin—Madison; 2010.

Alber, Glenn et al.; "Battery Monitoring: Why Not Do It Right?", Albercorp.; 1998.

Lam, Long; "A Practical Circuit-Based Model for State of Health Estimation of Li-ion Battery Cells in Electric Vehicles", Master of Science Thesis, University of Technology Delft; Aug. 2011.

McCabe, Paul et al.; "Protecting the Power Source", The Raymond Corporation, iBattery White Paper; Oct. 2011.

Niedermeyer, Gabriela; Invitation to Pay Additional Fees with Communication Relating to the Results of the Partial International Search for PCT Application No. PCT/US2014/025528; date of mailing Jul. 30, 2014; European Patent Office; Rijswijk, Netherlands.

Hopwood, Stephen; Notification of Transmittal of the International Preliminary Report on Patentability including attached accompanying annex of the Letter Accompanying Replacement Sheets and Amendment under Article 34 Made Simultaneously with the Demand for Examination for PCT Application No. PCT/US2014/025528; date of mailing Mar. 17, 2015; European Patent Office; Munich, Germany.

* cited by examiner

FRACTIONAL DEPLETION ESTIMATION FOR BATTERY CONDITION METRICS

CROSS REFERENCE TO RELATED APPLICATIONS

This application claims the benefit of U.S. Provisional Patent Application Ser. No. 61/792,907, filed Mar. 15, 2013, entitled FRACTIONAL DEPLETION ESTIMATION FOR BATTERY CONDITION METRICS, the disclosure of which is hereby incorporated by reference.

BACKGROUND

The present disclosure relates in general to battery management, and in particular, to the evaluation of a battery state based upon a fractional depletion estimation.

Industrial batteries represent a significant operating cost for operators of fleets of industrial vehicles. In this regard, operating cost is realized in both servicing the battery (e.g., recharging the battery, performing maintenance on the battery, etc.) and in replacement of a worn out battery.

Lead-acid batteries represent a predominant type of industrial battery, especially for electrically operated vehicles such as forklift trucks. However, despite over one hundred years of proven reliability in use and relatively low acquisition cost per kilowatt hour, lead-acid batteries, like all batteries still require service and eventual replacement.

BRIEF SUMMARY

According to various aspects of the present disclosure, a method of evaluating battery state is provided. The method comprises collecting samples of an operating condition of a battery that is used to power an electric load. For instance, the magnitude of current drawn from the battery may be sampled at a periodic interval. The method also comprises determining fractional depletion contributions of the collected samples to a state of the battery. Also, the method generating a depletion estimate associated with the state of the battery based upon an accumulation of the fractional depletion contributions. As an example, a battery state such as state of health (SOH) can be estimated by monitoring the accumulated fractional depletion contributions due to use, over the life of the battery.

According to further aspects of the present disclosure, a method of evaluating a battery state is provided. The method comprises collecting samples of battery current flow to generate current samples of a battery used to power an electric load. The method also comprises sorting the current samples into a plurality of bins according to the respective values of the current samples. Still further, the method comprises evaluating at least some of the plurality of bins to determine bin fractional depletion contributions to the state of the battery, e.g., based upon the accumulated current samples in the evaluated plurality of bins. In this regard, the evaluation is based upon a comparison of the accumulated samples to a curve that characterizes battery lifetime amp-hours as a function of current. For instance, the method may determine the fractional depletion contributions of each bin to the state of the battery by summing, for each bin, the fractional contributions of each current sample contained in that bin. Also, the method comprises combining the evaluated bin fractional depletion contributions into a depletion estimate to evaluate the state of the battery.

According to yet further aspects of the present disclosure, a method of evaluating a battery state is provided. The method comprises transforming a time based history of a load on a battery, into a spectral representation of that history in a load domain. For instance, the spectral representation may have a spectra comprised of a plurality of spectral lines that represent the load. The method also comprises comparing the spectral representation to an expected battery capability for the load represented by spectral lines in the spectra, and calculating a fraction of the expected capability used at the spectral lines used in the comparison. The method still further comprises aggregating the calculated fractions into a total fraction that represents the estimated fraction of the expected battery capability associated with the time based history.

DETAILED DESCRIPTION

According to various aspects of the present disclosure, approaches are provided for evaluating a battery state, e.g., for estimating effects such as the damaging or depleting effects of a discharge load history on identified battery condition metrics. In this regard, the approaches described herein are useful for estimating health-based aspects of batteries. In particular, the approaches herein are well suited for evaluating a battery state of lead-acid batteries typically used in industrial vehicles.

As will be described in greater detail herein, a battery metric may be estimated for a battery under evaluation by transforming a time-based history of the load (e.g., current draw vs. time) on the battery into a spectral representation of that history in a "load" domain. For instance, in an example of current draw vs. time, the spectral representation may be implemented in a load domain that characterizes current (e.g., current vs. amp-hours discharged). With the load history transformed to a load domain, the evaluation comprises comparing the spectral representation to an expected battery capability, e.g., a metric of the battery condition. For a discrete spectrum, the comparison is implemented for the load represented by each line in the spectrum. The individual contributions of each line can be summed to compute an overall measure.

For instance, a measure of depleted amp-hours at a given magnitude of current draw can be compared to a curve, such as a plot of lifetime ampere-hour throughput expectation vs. discharge rate. The evaluation then calculates the fraction of the expected capability used at each spectral line, and aggregates those fractions into a total fraction that represents an estimate of the expected capability 'consumed by,' 'depleted by' or otherwise associated with that particular time history. In this manner, techniques are provided to assess the cumulative effect, e.g., damage, depletion, consumption or other measurable metric associated with the battery. For instance, the determined cumulative effect on a battery for an industrial vehicle can be utilized to estimate the lifetime, remaining life expectancy, amount of battery consumed or otherwise depleted, etc.

System Architecture

Aspects of the present disclosure comprise systems that enable industrial vehicles to wirelessly communicate with applications deployed in an enterprise computing environment. As used herein, an industrial vehicle is any equipment that is capable of moving or otherwise being moved about a work site. Exemplary industrial vehicles include materials handling vehicles, such as forklift trucks, reach trucks, turret trucks, walkie stacker trucks, tow tractors, hand operated pallet trucks, etc.

Figure 1:
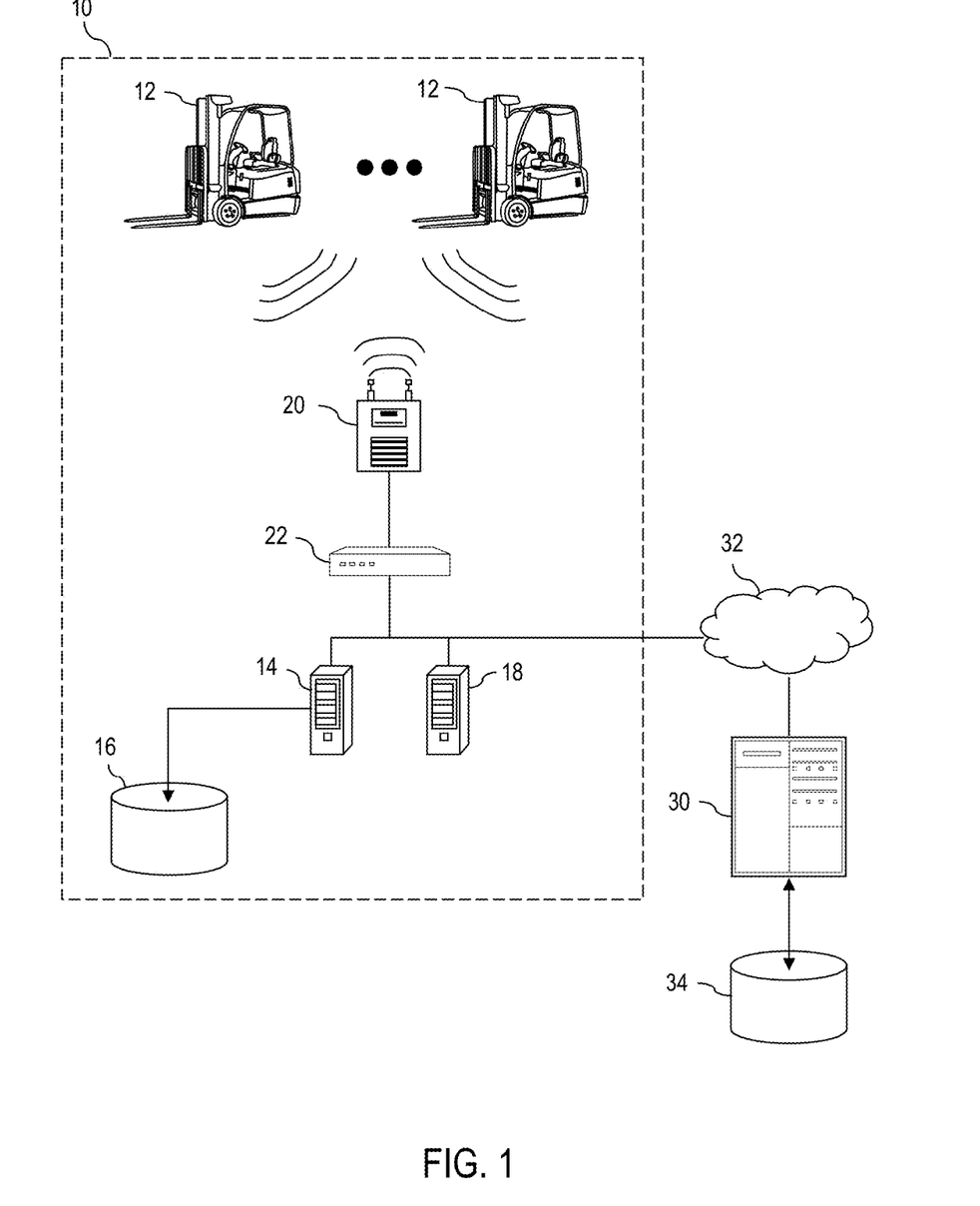
FIG. 1 is a schematic of an illustrative operating environment in which aspects of the disclosure herein may be practiced.

Referring now to the drawings and particularly to FIG. 1, an exemplary computing environment 10 is illustrated, which includes components that support wireless communication capabilities. A plurality of industrial vehicles 12, such as materials handling vehicles (shown as forklift trucks for convenience of illustration), each include a communications device that enables that industrial vehicle 12 to wirelessly communicate with a processing device, such as an industrial vehicle application server 14. The industrial vehicle application server 14 may further interact with a data resource 16, e.g., one or more databases, data stores or other sources of information, to facilitate interaction with the industrial vehicles 12 as will be described in greater detail herein.

The computing environment 10 may further support additional processing devices 18, which may comprise for example, servers, personal computers, etc. One or more of the processing devices 18 may also communicate with the industrial vehicles 12 and/or the industrial vehicle application server 14 across the computing environment 10.

The wireless communication architecture may be based upon a standard wireless fidelity (WiFi) infrastructure, such as may be deployed using standard 802.11.xx wireless networks for a communications protocol. However, any other suitable protocol may alternatively be implemented. In an exemplary WiFi implementation, one or more wireless access points 20 may be utilized to relay data between a wireless transceiver of each industrial vehicle 12 and one or more wired devices of the computing environment 10, e.g., the industrial vehicle application server 14.

Moreover, the computing environment 10 may be supported by one or more hubs 22 and/or other networking components that interconnect the various hardware and/or software processing devices, including for example, routers, firewalls, network interfaces and corresponding interconnections. The particular networking components provided in the computing environment 10 may thus be selected to support one or more intranets, extranets, local area networks (LAN), wide area networks (WAN), wireless networks (WiFi), the Internet, including the world wide web, and/or other arrangements for enabling communication across the computing environment 10, either real time or otherwise, e.g., via time shifting, batch processing, etc.

Also, one or more computing devices may further communicate with a remote server 30, such as across a network 32 such as the Internet. The remote server 30 may comprise, for example, a third party server (e.g., operated by the industrial vehicle manufacturer) that interacts with the industrial vehicles 12, the industrial vehicle application server 14 and/or other processing devices 18 of the computing environment(s) 10. The remote server 30 may further interact with a data resource 34, e.g., one or more databases, data stores or other sources of information.

Industrial Vehicle Data Collection

Figure 2:
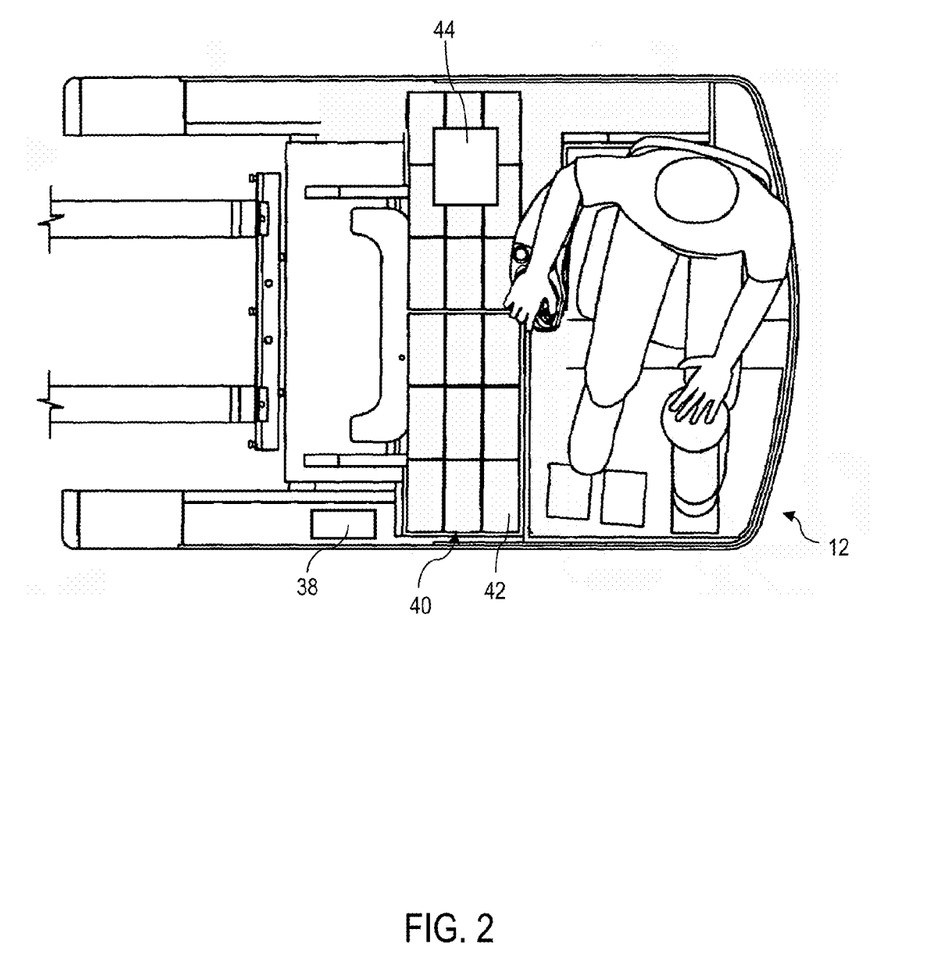
FIG. 2 is a view of an operator in an industrial vehicle, where the industrial vehicle includes a battery, a battery management system and an information linking device for wirelessly communicating with a computing environment, according to aspects of the present disclosure.

Referring to FIG. 2, an industrial vehicle 12 includes a communication device referred to herein as an information linking device 38, a battery 40 comprised of a plurality of battery cells 42 and a battery monitor 44 that allows monitoring of battery characteristics, e.g., current, voltage, resistance, temperature, water level, etc.

The information linking device 38 and other aspects of the industrial vehicle 12, as well as the corresponding computer environment such as that described with reference to FIG. 1, can incorporate any of the features and structures as set out in U.S. Pat. No. 8,060,400 to Wellman, entitled "Fleet Management System", the disclosure of which is incorporated by reference in its entirety.

Notably, the information linking device 38 can include a display, a transceiver for wireless communication, e.g., with the application server 14, I/O, a processor, memory for storing collected data about the corresponding industrial vehicle, etc., as described more fully in U.S. Pat. No. 8,060,400 to Wellman, entitled "Fleet Management System".

In exemplary implementations, the information linking device 38 is coupled to and/or communicates with other industrial vehicle system components via a suitable industrial vehicle network system, e.g., a vehicle network bus. The industrial vehicle network system is any wired or wireless network, bus or other communications capability that allows electronic components of the industrial vehicle 12 to communicate with each other. As an example, the industrial vehicle network system may comprise a controller area network (CAN) bus, ZigBee, Bluetooth, Local Interconnect Network (LIN), time-triggered data-bus protocol (TTP) or other suitable communication strategy. As will be described more fully herein, utilization of the industrial vehicle network system enables seamless integration of the components of the industrial vehicle information linking device into the native electronics including controllers of the industrial vehicle 12 and optionally, any electronics peripherals associated with the industrial vehicle 12 that integrate with and can communicate over the network system.

The battery monitor 44 communicates with the information linking device 38, the information server 14 or both. Moreover, the battery monitor 44 may be wired to the information linking device 38, or the battery monitor 44 may communicate with the information linking device 38 using a wireless technology such as Bluetooth, etc. The battery monitor 44 may include a processor, memory and other electrical structures to implement battery monitoring. Moreover, the battery monitor 44 may interface with various sensors, such as a current sensor, one or more temperature sensors, a water level sensor, voltage sensor, etc. to sample battery characteristics of interest. The results can be stored on the battery monitor itself, or the samples can be communicated to the information linking device 38 for processing, storage, forwarding to the information server 14, etc.

Battery Monitoring

The battery monitor 44 may implement the fractional depletion estimation techniques as set out herein. In alternative implementations, the battery monitor 44 cooperates with the information linking device 38 to implement the fractional depletion estimation techniques as set out herein. Here, the battery monitor 44 may provide the samples and the information linking device 38 may perform the storage and analysis. Other configurations that share responsibility of sample collection, storage and processing between the battery monitor 44 and information linking device 38 are also within the spirit of the disclosure herein. In still further alternative implementations, the battery monitor 44, the information linking device 38, the information server 14 or combinations thereof, cooperate to implement the fractional depletion estimation techniques as set out herein. For instance, the battery monitor 44 may send information directly to a server computer, such as information server computer 14 for storage, processing and analysis. In another illustrative example, the information linking device 38 serves as an intermediate to pass battery information from the battery monitor 44 to the information server computer 14, to manipulate information from the battery monitor 44 before forwarding the manipulated information to the server 14, etc.

Fractional Depletion Estimation

Figure 3:
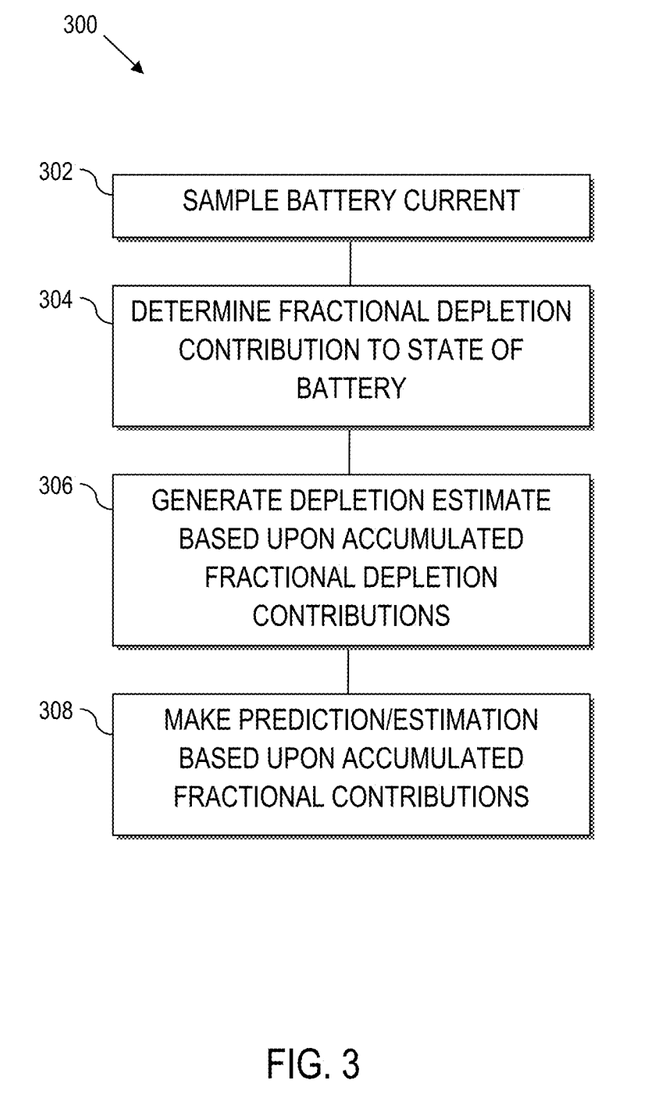
FIG. 3 is a flow chart of a method for performing a fractional depletion estimation, according to aspects of the present disclosure.

The fractional depletion approaches herein can be understood with reference to FIG. 3, which illustrates a method 300 of evaluating a battery state, such as a current state of a battery characteristic. The state of a battery may comprise for example, battery state of health. In this regard, the method 300 can be utilized to determine a depleted capacity of the battery state (e.g., depleted capacity of the battery with regard to state of health as an illustrative example).

The method comprises collecting samples at 302, of an operating condition of a battery that is used to power an electric load. For instance, the method may implement sampling of the battery current flow from a battery used to power an electric load (e.g., a battery installed in an industrial vehicle as described with reference to FIGS. 1 and 2). The sampling at 302 provides a time-based history of the load on the battery (e.g., current draw vs. time).

For instance, as described more fully with reference to FIGS. 1 and 2, an industrial vehicle 12 may include a battery monitor 44 that allows the current drawn by the industrial vehicle battery 40 to be sampled over time. In this regard, the collected samples can be stored on the battery monitor 44 or on the information linking device 38. As yet another example, the information linking device 38 or the battery monitor 44 can be used to wirelessly communicate the collected sample data to the industrial server 14 for storage and processing.

The sampling frequency for collecting samples from the battery monitor 44 may be selected based on a number of factors, such as the electric device being powered by the battery, the storage available for storing samples, the desired sampling resolution, etc. As an illustrative example, for a battery of an industrial vehicle, a sample rate of between 1 Hz-10 Hz may be utilized to measure the current drawn from the battery. Of course, other sampling rates may be utilized.

The method 300 also comprises determining at 304, fractional depletion contributions of the collected samples to a state of the battery. For instance, the determination may be carried out by evaluating each sample to determine a corresponding fractional depletion of the state of the battery associated with each sample.

As an example, the determination at 304 may transform the samples from a time-based history of the load on the battery into a 'spectral' representation of that history in a "load" domain. Where current draw is sampled, the domain is designated as a "current" domain. In discrete implementations, the spectral representation may have a spectra comprised of a plurality of spectral lines that represent the load, e.g., each spectral line may correspond to a value (or range of values) of current draw.

As will be described in greater detail herein, these spectral lines can define bins that are used to sort the accumulated samples. In illustrative implementations, the transformation can occur "on the fly". For instance, each time a sample is collected, that sample may be binned based upon the value (e.g., magnitude) of that sample. Thus, a memory accumulates the sample values over time into bins, sorting the samples based upon value. As noted above, this memory may reside on the battery monitor 44, the information linking device 38, server computer 14, (or anyplace else it is desirable to store the data). Alternatively, the samples may be collected as a time series of values that are pinned at a later time.

The determination at 304 may also compare the spectral representation (the samples transformed into the load domain) to an expected battery capability (e.g., lifetime amp-hours) for the load represented by spectral lines in the spectra. For instance, the spectral representation may be compared to an expected battery capability for a certain metric (e.g., current) of the battery for each line in the spectral representation. As will be described in greater detail herein, the expected capability, e.g., lifetime amp-hours, may be expressed as a curve. The determination at 304 thus compares the sample contributions of each load line against the curve to calculate the fraction of the expected capability used at each spectral line. For instance, the determination may calculate a fraction of the expected battery capability used at the spectral lines in the comparison.

The method 300 also comprises generating, at 306, a depletion estimate associated with the state of the battery based upon an accumulation of the fractional depletion contributions. For instance, the method may aggregate the calculated fractions into a total fraction that represents an estimate of the expected battery capability consumed, depleted, remaining, etc., which is associated with a particular time history.

Keeping with the above example, in illustrative implementations, the method accumulates the fractional depletion contributions of each spectral line (e.g., binned sample data) to derive an overall fractional depletion estimate, which is used to evaluate the state of the battery.

In illustrative implementations, the sampled battery data is aggregated into a load history (e.g., a set of bins) that grows over time, over the lifetime of the battery. In this case, the resulting total fractional depletion represents the historic use over the life of the battery. In other examples, battery use can be captured in discrete load histories, where the various load histories are aggregated to represent the historic use over the life of the battery.

In other exemplary implementations, the time information of the collected samples is preserved such that further or alternative analysis can be run. For example, an analysis can be run on individual, time bounded load histories. This may be useful, for instance, to evaluate specific situations, e.g., tracking the depletion for a given operation or set of operations.

The method 300 may also comprise making predictions or estimations at 308, based upon the accumulated fractional contributions, as the state of the battery.

For instance, the state of the battery may be identified by evaluating the depletion estimate and outputting a prediction of how much of a battery capacity has been depleted based upon the evaluation of the depletion estimate. For instance, the prediction may simply identify the accumulated depletion estimate computed at 306. Thus, the depletion estimate can be used to predict, for instance, "how much of a total capability has been used". As an example using state of health, the prediction at 308 may indicate that X % of the expected battery life has been depleted.

As another example, the state of the battery may be identified by evaluating the depletion estimate and outputting a prediction of how much of a battery capacity is remaining based upon the evaluation of the depletion estimate. That is, the depletion estimate can be used to predict, for instance, "how much of a total capability is remaining" Here, the computation may be $(1-X=Y)$ where X is the fractional depletion estimate computed at 306. Keeping with the example using state of health, the prediction at 308 may indicate that Y % of the expected battery life is remaining. In still alternative examples, a business decision may be reached to change a battery before the expected end of life (e.g., at 95% expected life, thus making the prediction $(0.95-X)$ where X is the depletion estimate computed at 306). Thus, a prediction based upon remaining capacity is not limited to the comparison of the computed depletion estimate to 100% depletion of that capacity.

As yet another example, the state of the battery may be identified by evaluating the depletion estimate and outputting a prediction of an interval until an occurrence of an event of interest related to the battery state (such as state of health, state of charge, etc.), based upon the evaluation of the depletion estimate. This estimation is "how much more work can be done" before the battery capability has been depleted, a battery recharge is required, etc. The interval may be determined based upon time, energy used, or any other measurable parameter. Keeping with the above example of state of health, the prediction at 308 may indicate that the battery has Y months of life left until the battery has been depleted. As another example, the prediction at 308 may indicate that a battery charge will be required "before the end of a shift", "in the next two hours", "after the next five picks", etc. The prediction in this regard will likely require additional information, which can be derived from aggregated historical data (e.g., how much work a typical battery does over an interval). Alternatively, historical data related to the use of the particular battery in question may be considered when making predictions. For instance, if a historical account indicates that a given battery depletes about 1.667% of its life per month of use, then the system may infer that the battery will need to be replaced every five years. In this example, if the battery is four years old, and the depletion estimate computes to 80% depleted, the system can predict that the battery will need to be replaced in one year.

The above predictions are not limited to state of health determinations. Moreover, other manipulations of the fractional depletion estimate computed at 304 are within the spirit of the invention.

As used herein, the state of health (SOH) refers generally to the wear, aging, etc., of a battery. Thus, the SOH can be used as a measure of the useful life left in a battery. Notably, the various aspects of the present disclosure are not meant to be limited to SOH determinations. Rather, the approaches herein can be applied more generally to various battery metrics.

Sampling Current Draw

According to illustrative aspects of the present disclosure herein, collecting samples of an operating condition of a battery may be implemented by sampling current drawn from the battery to accumulate a plurality of current samples.

In an illustrative implementation, the plurality of current samples is collected into bins to group the samples based upon sample value. For instance, the samples may be collected into bins by collecting the plurality of current samples over a load history, defining a plurality of bins, where each bin corresponds to at least one current value (e.g., magnitude of the current), and accumulating the samples in the bins such that each current sample of the load history is accumulated into a single bin based upon the value of the current sample.

The bins may be assigned through a bin allocation process that sets the minimum bin value, maximum bin value, number of bins, bin resolution, etc. In alternative implementations, the bin number, size, etc., is predetermined and preconfigured. The determination of the bin number, size, spacing and other attributes may be based upon a number of factors. For instance, the bins may be defined such that each bin corresponds to at least one current value (but each bin may represent a range of current values), such that each current sample of the load history is accumulated into a single bin based upon its data value. That is, each bin can be narrow, such as to hold samples of only a single current value, e.g., 400 amps. Alternatively, a bin can hold samples that fall within a range of current values, e.g., 400-410 amps. Moreover, when the evaluation is performed using a reasonably large history, the data values themselves can be evaluated to set the bin minimum value, bin maximum value, bin resolution/spacing, etc.

Alternatively, there may be a certain level of domain knowledge that should allow an implementation to get "in the ballpark" without relying upon a detailed history. Still further, the bin allocation may be fixed for the life of the battery, or the bin allocation may be changed from time to time. For instance, it may be desirable to use historical data to scale/weight the bin selection process (possibly different resolution as a function of current, etc.) to distribute the data in a desired manner.

In an illustrative implementation, battery state of health is to be determined. In this regard, the method 300 looks to determine the cumulative damage/fatigue that has occurred to the battery to estimate/predict remaining battery life, to predict the amount of life already consumed, or both. To do so, the method determines the fractional depletion contributions of each bin and accumulates the fractional depletion contributions into a depletion estimate by accumulating the fractional contributions of the samples collected into each bin.

For instance, the determination at 304 may be implemented by transforming the accumulated current samples so as to derive a use estimate for each bin. This may be accomplished by integrating across each bin to determine discharged amp-hours represented by the bin. The integration may be performed by multiplying a count of the number of samples in a selected bin by a current value associated with the bin times a sample interval used to collect the current samples.

This implementation further comprises identifying a curve that characterizes battery lifetime amp-hours as a function of current. The implementation further compares the computed discharged amp-hours for each bin to the identified curve, e.g., by computing a quotient for each bin based upon the computed discharged amp-hours for that bin and a magnitude associated with a point on the curve identifying lifetime amp-hours for that bin. Each computed quotient is accumulated, and the accumulated total (depletion estimate) is used to predict an amount of life of the battery used up by the load history.

The prediction at 308 may be performed "on-the-fly" or "off-line". For instance, the prediction may be "off-line", e.g., not performed in real time. As an example, an operator interacting with data stored on the server 14 may run a historical report based upon data collected on an industrial vehicle, e.g., by the information linking device, and which is wirelessly transmitted to the remote server. As another illustrative example, the prediction may be performed on a materials handling vehicle on-the-fly as samples are recorded by a processor of the materials handling vehicle. Still further, the on-the-fly processing may be implemented directly on the battery monitor 44.

Certain implementations may clear current samples from bins after being wirelessly transmitted to a remote server. Alternative configurations may combine the evaluated bin fractional contributions of current samples collected over the life of the battery to evaluate the state of the battery.

Exemplary Fractional Depletion Estimation Techniques Overview

An illustrative method of evaluating a battery state may be implemented by collecting samples of battery current flow to generate current samples of a battery used to power an electric load. This illustrative method further comprises sorting the current samples into a plurality of bins according to the respective values of the current samples and determining a fractional contribution to the state of the battery for samples contained in the bins. For instance, the determination may be implemented by evaluating at least some of the plurality of bins to determine bin fractional depletion contributions to the state of the battery made by accumulated current samples in the evaluated plurality of bins, where the evaluation is based upon a comparison of the accumulated samples to a curve that characterizes battery lifetime amp-hours as a function of current.

This illustrative method further comprises evaluating each bin to determine a bin fractional contribution to the state of the battery made by any current samples contained in the bin and combining the evaluated bin fractional depletion contributions into a depletion estimate to evaluate the state of the battery.

Example

One aspect of the present invention relates to a method of evaluating a battery state, e.g., according to the method of FIG. 3, in terms of an estimation or prediction of the damage that has occurred to a battery due to a discharge event. A fractional depletion estimation of battery life based upon discharge can be generalized based upon the method of FIG. 3, into the following process.

The process collects samples of an operating condition of a battery that is used to power an electric load (e.g., analogous to 302 of FIG. 3). In this example, the operating condition is a measure of the current flowing into and/or out of a battery (e.g., industrial vehicle battery).

The process also determines fractional depletion contributions of the collected samples to a state of the battery, e.g., analogous to 304 of FIG. 3. In this exemplary implementation, the samples are collected into a "Load History". The load history can be defined as any interval of time over which samples are collected. In an example, the life of a battery is characterized in a single load history. Alternatively, consecutive load histories can be collected and stored. In this implementation, each load history need not be of the same length or interval. Moreover, it is possible to simplify a load history to the trivial case of a single sample.

The use of one or more load histories facilitates predicting an accumulated depletion in a capacity related to the battery state, based upon the depletion estimate for the load history, or based upon the load history plus the fractional depletion estimates of previously collected and aggregated load histories.

As noted in greater detail herein, the sample rate can be any reasonable sample rate. An exemplary sample rate is between 1 Hz-10 Hz.

The process then determines corresponding fractional depletion contributions of the collected samples to a state of the battery. For instance, referring to FIG. 4, an exemplary load history 400 is illustrated. The exemplary load history 400 comprises a plurality of samples 402 that record the DC bus current in amperes as a function of time.

Figure 4:
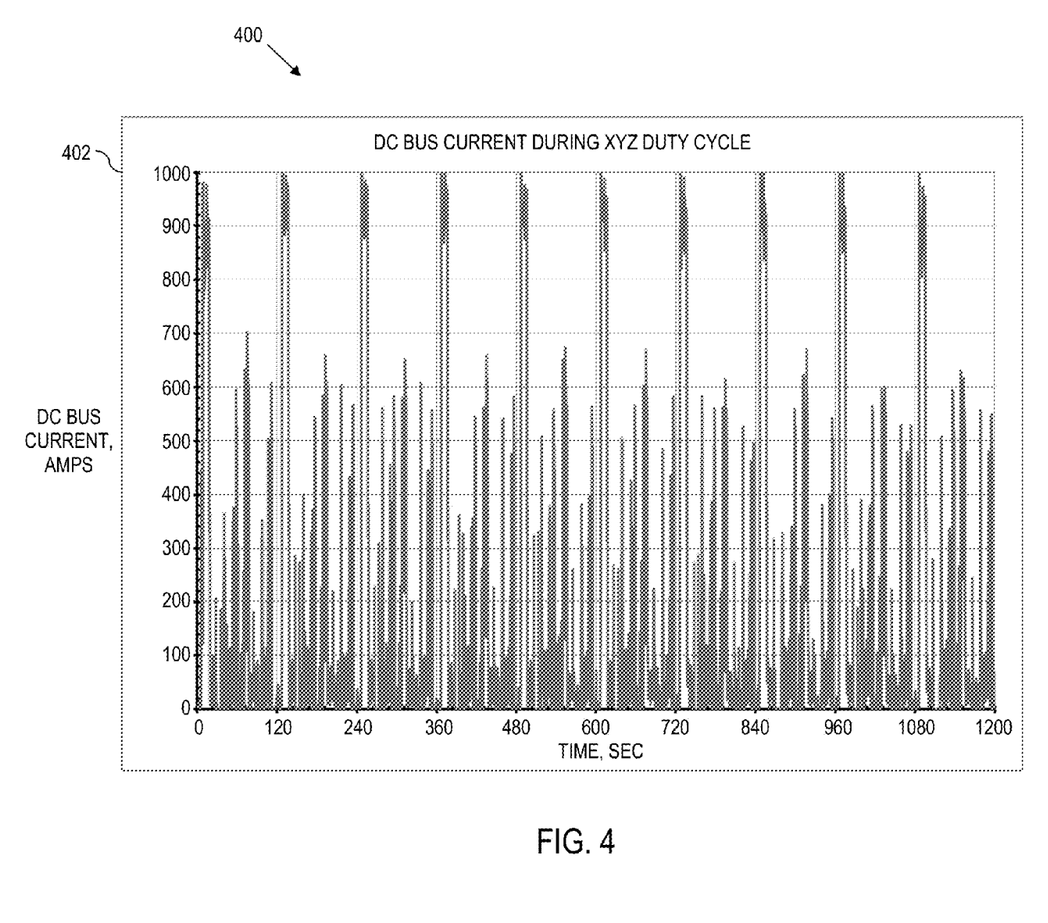
FIG. 4 is a representation of an exemplary load history that may be used to compute a fractional depletion estimation, according to aspects of the present disclosure.

The (time-based) load history is transformed into a spectral representation in the 'current domain.' To transform the load history into a spectral representation of the sample data, the range of measured current sampled in the load history is divided into several spectral bands (bins). This can be conceptualized as a histogram of the samples, with the current on the axis of the abscissa.

As noted above, the minimum bin value and maximum bin value, range, bin resolution, number of bins, bin size etc., may be determined based upon the resolution of the desired result and based upon the nature of the metric under evaluation. Other factors to consider when setting the process parameters include the possible dynamic range of the current requirements/demand from the vehicle, the size of the battery, and dynamic sampling system constraints. In an exemplary case, the bin size was chosen as 2.5% of the 1C-rate of the battery and the range was chosen as 0 to 120% of the 1C-rate of the battery, resulting in a 25 amp bin size and range of 0 to 1200 amps for the 1000 Ahr battery in this example. Other bin sizes and ranges may be acceptable, depending upon the application.

The process then transforms the accumulated current samples so as to derive a use estimate for each bin. In an illustrative example, a "frequency count" is compiled, i.e., count of the number of samples in each band. The process converts the 'frequency count' at each bin level to the amp hour (Ahr) discharged at that level, such as by performing some form of integration on each band (bin), resulting in the 'spectral plot' of Ahr discharged vs. discharge rate.

A use estimate may comprise for instance, a measure of the Spectral Band Amp-hours (Ahr) discharged. Thus, in one example, simply stated, the integrated value at each bin level is:

$$Ahr = (\text{\# of counts}) \times (\text{the bin current}) \times (\text{sampling interval})$$

This formula may be adjusted, e.g., based on the specific application and preference for integration method (rectangular, trapezoidal, etc.) and the numerical technique used by the particular frequency counting or histogram algorithm being used.

Figure 5:
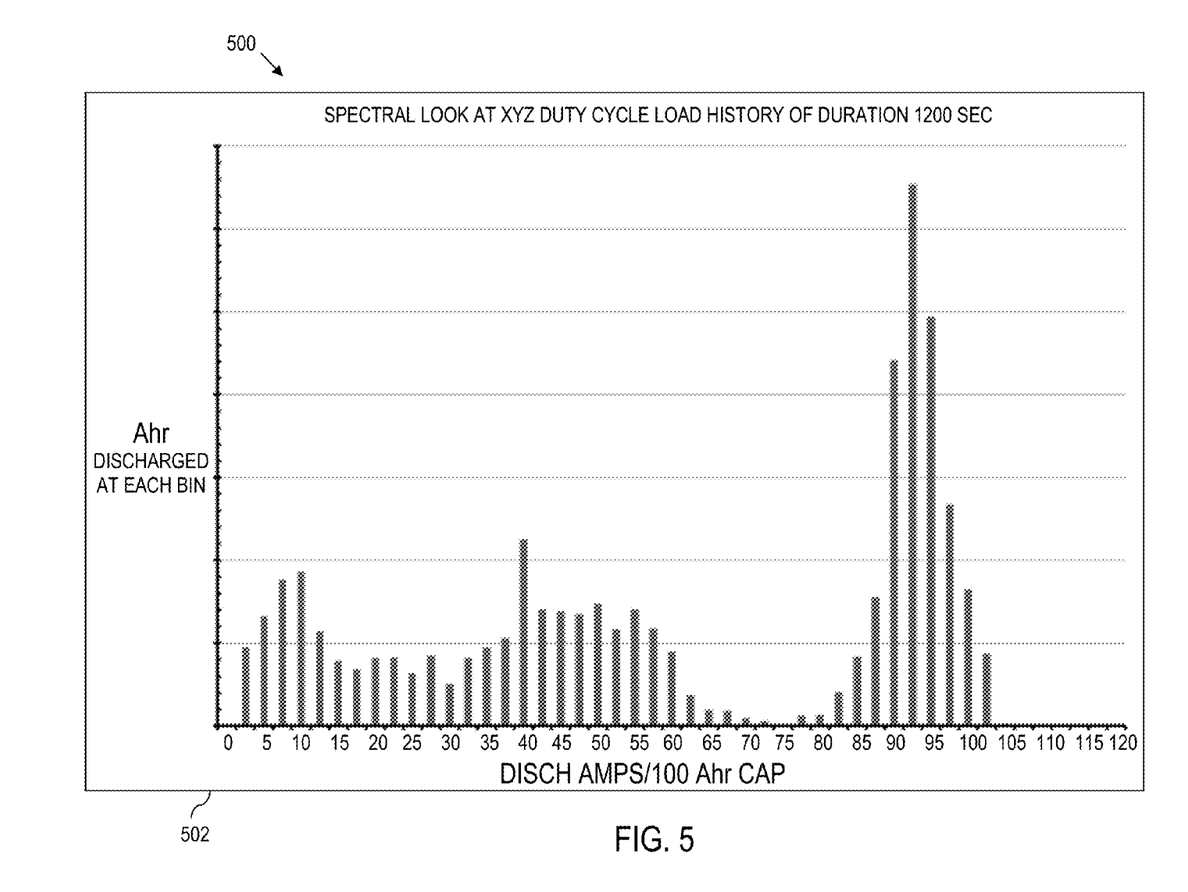
FIG. 5 is a representation of an exemplary current domain spectrum that may be used to compute a fractional depletion estimation, according to aspects of the present disclosure.

Referring to FIG. 5, a spectra 500 illustrates the use estimates 502 plotted in the histogram. In the above-example, Spectral Band Amp-hours (Ahr) discharged at each bin are plotted on the axis of the ordinate. The discharge rate, expressed as current in amperes per 100 amp-hours, is plotted on the axis of the abscissa.

Figure 6:
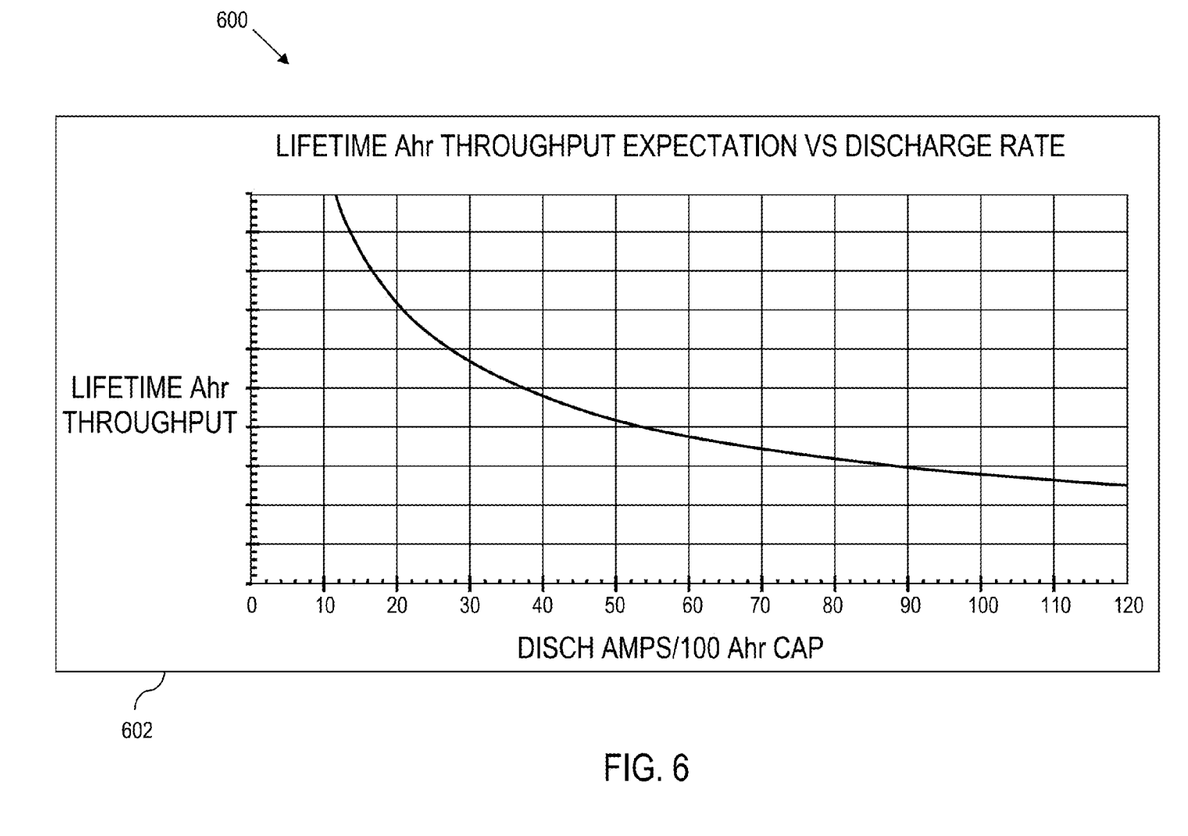
FIG. 6 is a representation of an exemplary curve that may be used to compute a fractional depletion estimation, according to aspects of the present disclosure.

The process then compares each computed use estimate (e.g., Spectral Band Amp-hours (Ahr)) to a corresponding battery characteristic (e.g., capability based upon a battery curve). An example curve represents a battery characteristic as a function of current, e.g., Lifetime Ahr as a function of discharge amps. The process may then compute a fractional depletion (e.g., a total spectral band contribution) for each spectral band in the current domain, based upon the comparison with the battery characteristic represented in the curve.

For example, consider a plot of data, such as may be supplied by a battery manufacturer, which represents the expected battery life (expressed as lifetime Ahr throughput) as the metric of battery condition expressed in the same load 'domain' as the spectral load history plot. Other metrics of battery condition could also be considered. The process calculates the fraction of the expected capability used at each spectral line.

The process further generates a depletion estimate associated with the state of the battery based upon an accumulation of the fractional depletion contributions, e.g., analogous to 306 of FIG. 3. For instance, the process aggregates the computed fractions at each spectral line into a total fraction that represents the estimated fraction of the expected capability 'consumed' or 'depleted' by that particular time history.

In an exemplary implementation, the fraction at each spectral line is the quotient of the magnitude of that spectral line (in some unit of charge, Ahr in this case) divided by the magnitude of the expectation at the same discharge rate as the spectral line (expressed in the same unit of charge, Ahr in this case).

That is, the process compares for each bin, the corresponding use estimate for that bin with a corresponding point on the curve and computes therefrom, a fractional depletion estimate that estimates the fraction of the expected characteristic of the battery depleted by the current samples in the bin.

Referring to FIG. 6, an exemplary curve 600 is illustrated. The curve plots lifetime amp/hours 602 as a function of discharge amps. The process essentially matches each bin to its corresponding discharge amps value on the abscissa of FIG. 6. The capability used for that bin is compared to the lifetime Amphours of FIG. 6 to determine a fractional depletion.

For instance, for a SOH determination, each fractional depletion value corresponds to a fraction of the expected capability used at each spectral line, e.g., a quotient computed by dividing the use estimate (e.g., Spectral Band Amp-hours in this case) by a corresponding point on the curve (e.g., lifetime Ahr measure from the battery characteristic in this example).

The fractions calculated for each spectral line are then summed. The total fraction represents the estimated fraction of the expected capability that has been depleted. For example, if the expected capability is in units of lifetime Ahr throughput and the fraction is 0.25, then it is estimated that 25% of the lifetime has been depleted by the particular load history that was evaluated.

In broad terms, aspects of the present disclosure can be practiced 'off-line' by operating on a recorded time history, or 'on-line' (or 'on the fly') by sampling the current as it occurs on the vehicle and subsequently 'binning' the counts and incrementing the spectral lines and carrying out the 'Fractional Depletion' estimation calculations. This allows the opportunity to display results on the industrial vehicle, or to process the results off-line, e.g., using a reporting program of the server 14.

For the technique to be used 'on-line' there is no requirement to save a time-domain load history. However, the process still needs to bin each point and save the cumulative histogram. This could be viewed as a case where the length of the load history is only one (the last one) current sample. As such, the 'on-line' approach may alternatively be considered a 'recursive method'. This implementation is termed a "recursive method" because in the case of on-the-fly processing, the histogram continuously builds upon itself.

The process then aggregates the computed fractional depletion values to derive a load history contribution. This is a measure of the depletion contribution by the samples of the corresponding load history. Optionally, the process can further aggregate the load history contribution to previously determined load history contributions to determine a cumulative (e.g., lifetime aggregated value).

In an alternative implementation, a single histogram is maintained over the life of the battery, where new samples are aggregated into the above-defined computation. Moreover, the use of bins is presented for convenience of explanation. In practice, the use of bins can be resolved into an algorithm so that a formulaic approach is implemented. However, the concepts are similar to that described above.

According to aspects of the present disclosure, each sample may be independently saved. In this configuration, the system preserves a lot of flexibility for off-line processing. For instance, the information server 14 could define load histories in an ad-hoc manner at any given time for "off-line" analysis. That is, the server 14 can go back and run historical reports that look at damage in terms of particular historical periods, events, etc. The server 14 could even dynamically redefine the definition of bin width because the process can rebuild the histogram as the query dictates. However, this approach would cost in terms of storage requirements.

According to further aspects of the present disclosure, the system could save only the cumulative histogram. This allows the overall history to be preserved at a significant savings in storage, but limits the queries that can be run on the data, and may require that the number of bins and the size of each bin be predefined and fixed for the life of the battery.

The questions of what data, how much data, and where to store the data, are questions that come up when defining requirements for implementation in a practical, affordable fashion on the industrial vehicle. The data storage constraints in the battery module and bandwidth constraints when transmitting data to across the wireless network should be considered when selecting a particular implementation.

According to illustrative implementations, a recursive method is carried out on the battery module and the cumulative histogram and aggregated SOH result are stored on the battery module (e.g., battery module 44 described with reference to FIG. 2). Alternatively, data can be stored on an 'event triggered' basis where a time stamped 'snapshot' of the histogram and the aggregated result are captured, buffered in the module, and then sent to the server 14 via the information linking device 38 for permanent storage. A number of other data elements being sensed or calculated by the battery module can also be included in a record, e.g., battery temperature, fluid level, voltage, resistance, electrolyte warning, calculated state of charge, etc.

The 'event' may comprise for instance, the transition from the charging state (as when the battery is connected to the charger) to the discharging state (as when the battery is connected to the truck) or vice versa. This keeps storage size and data transmission to a minimum. Thus, the current SOH and cumulative load history can be obtained by querying either the module or a cloud of records on the server. The 'spectral' (histogram) history for any particular charge or discharge 'event' can also be obtained from the server based on the time stamped histogram records and some 'delta' calculations.

According to still further aspects of the present disclosure, the system may save only the aggregated result. This approach saves the most in data storage, but obviously reduces the types of queries that can be run against the data. If you do not save the cumulative histogram, you essentially reduce the approach to an algorithm.

Although described herein in general with regard to two-dimensional datasets, e.g., current and time, the disclosure is not so limited. Rather, any multi-dimensional data analysis may be implemented using the techniques set out herein. As an illustrative example, in a previous example, evaluating each current sample is implemented by determining the corresponding fractional contribution to the state of the battery based on a curve of the battery (e.g., life amp-hours vs. time). However, the corresponding fractional contribution to the state of the battery may be modified using an adjusting factor determined by an environmental parameter of the battery, such as temperature, age, etc. Alternatively, the curve may be a multi-dimensional curve, e.g., plotting life amp-hours vs. time vs. temperature.

Figure 7:
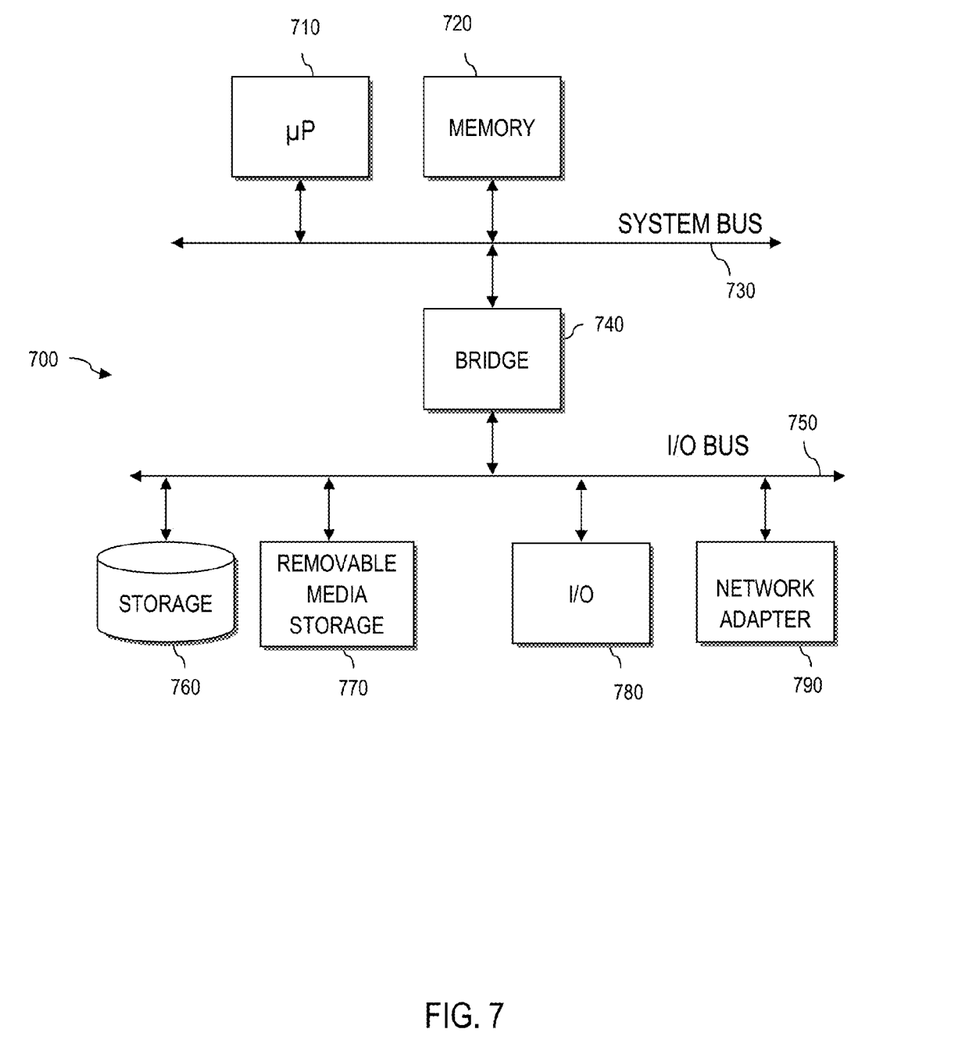
FIG. 7 is a diagram of an exemplary computer processing system for implementing the methods and processes described more fully herein.

Referring to FIG. 7, a schematic of an exemplary computer system having computer readable program code for executing aspects described herein with regard to the preceding FIGURES. The computer system can be in the server computer 14, the information linking device 38, the battery monitor 44, combinations thereof, etc.

The computer system 700 includes one or more microprocessors 710 that are connected to memory 720 via a system bus 730. A bridge 740 connects the system bus 730 to an I/O Bus 750 that links peripheral devices to the microprocessor(s) 710. Peripherals may include storage 760, such as a hard drive, removable media storage 770, e.g., floppy, flash, CD and/or DVD drive, I/O device(s) 780 such as a keyboard, mouse, etc. and a network adapter 790. The memory 720, storage 760, removable media insertable into the removable media storage 770 or combinations thereof, implement computer-readable hardware that stores machine-executable program code for implementing the methods, configurations, interfaces and other aspects set out and described herein.

Still further, the exemplary computer system may be implemented as an apparatus for evaluating a battery state, which may comprise a processor (e.g., microprocessor 710) coupled to a memory (e.g., memory 720, storage 760, removable media insertable into the removable media storage 770 or combinations thereof), wherein the processor is programmed to evaluate a battery state by executing program code to perform one or more of the methods set out herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device, e.g., the system described with reference to FIG. 7. Thus, a computer readable storage medium, as used herein, is not to be construed as being transitory signals per se, such as radio waves or other freely propagating electromagnetic waves through a transmission media.

Computer readable program instructions described herein can be downloaded to respective computing/processing devices from a computer readable storage medium or to an external computer or external storage device via a network, for example, the Internet, a local area network, a wide area network and/or a wireless network.

Aspects of the present disclosure are described herein with reference to flowchart illustrations and/or block diagrams. Each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, material s, acts, and equivalents of any means or step plus function elements in the claims below are intended to include any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

Having thus described the disclosure of the present application in detail and by reference to embodiments thereof, it will be apparent that modifications and variations are possible without departing from the scope of the disclosure defined in the appended claims.

What is claimed is:

1. A computer-implemented method of evaluating a battery state comprising:
   collecting, by a battery monitor that is coupled to an industrial vehicle battery, samples recorded by the battery monitor during use of an industrial vehicle, wherein the battery monitor has a processor coupled to at least one sensor to sample battery current, the samples are recorded at a predetermined sampling interval, and the samples represent a measure of a magnitude of a current discharged from a battery powering the industrial vehicle, thus creating a time-based history of a load on the battery during operation of the industrial vehicle;
   sorting, by a processor of the industrial vehicle, each collected sample into a corresponding bin, where each bin is associated with a value based on the magnitude of the current samples sorted into that bin, and each bin is stored in memory on the industrial vehicle that is accessible by the processor of the industrial vehicle;
   creating, by the processor of the industrial vehicle, a battery use estimate for each bin by multiplying a number of samples sorted into the bin by the value of the bin, and the sampling interval;
   determining, by the processor on the industrial vehicle, for each bin, a fractional depletion contribution of the battery by computing a quotient where the quotient is computed by dividing a lifetime expected estimate for that bin by the battery use estimate for that bin;
   generating, by the processor on the industrial vehicle, a depletion estimate associated with the state of the battery based upon an accumulation of the fractional depletion contributions; and
   outputting a measure of the battery state based upon the generated depletion estimate.

2. The method of claim 1 further comprising:
   identifying the state of the battery by evaluating the depletion estimate and outputting a prediction of how much of a battery capacity has been depleted based upon the evaluation of the depletion estimate.

3. The method of claim 1 further comprising:
   identifying the state of the battery by evaluating the depletion estimate and outputting a prediction of how much of a battery capacity is remaining based upon the evaluation of the depletion estimate.

4. The method of claim 1 further comprising:
   identifying the state of the battery by evaluating the depletion estimate and outputting a prediction of an interval until an occurrence of an event of interest related to the battery state, based upon the evaluation of the depletion estimate.

5. The method of claim 1, wherein:
   collecting, by a battery monitor that is coupled to an industrial vehicle battery, samples recorded by the battery monitor during use of an industrial vehicle comprises:
      collecting the current samples over a load history; and
   sorting, by a processor of the industrial vehicle, each collected sample into a corresponding bin comprises:
      accumulating each current sample of the load history into a corresponding bin based upon the value of the current sample, where each bin stores only samples accumulated during the load history.

6. The method of claim 1 further comprising:
   predicting an accumulated depletion in a capacity related to the battery state, based upon the depletion estimate for the load history.

7. The method of claim 6, wherein:
   predicting an accumulated depletion in a capacity related to the battery state further comprises:
      predicting the accumulated depletion in the capacity based upon the depletion estimate for the load history plus the fractional depletion estimates of previously collected and aggregated load histories.

8. The method of claim 1, wherein:
   determining, by the processor on the industrial vehicle, for each bin, a fractional depletion contribution of the battery comprises:
      identifying a curve that represents a battery characteristic as a function of current; and
      comparing each battery use estimate with an associated point on the curve, and computing therefrom, a fractional depletion estimate that estimates the fraction of the expected characteristic of the battery depleted by the current samples in the corresponding bin.

9. The method of claim 8, wherein:
   creating, by the processor of the industrial vehicle, a battery use estimate for each bin by multiplying a number of samples sorted into the bin by the value of the bin, and the sampling interval further comprises:
      integrating across each bin to determine discharged amp-hours represented by the bin.

10. The method of claim 9, wherein:
    identifying a curve that represents a battery characteristic comprises:
       identifying a curve that characterizes battery lifetime amp-hours as a function of current; and
    comparing each battery use estimate with an associated point on the curve comprises:
       comparing the computed discharged amp-hours for each bin to an associated point on the curve identifying lifetime amp-hours for that bin.

11. The method of claim 10, wherein:
    comparing the computed discharged amp-hours for each bin comprises:
       computing a quotient for each bin based upon the computed discharged amp-hours for that bin and a magnitude associated with a point on the curve identifying lifetime amp-hours for that bin.

12. The method of claim 11, wherein:
generating a depletion estimate associated with the state of the battery based upon an accumulation of the fractional depletion contributions comprises:
accumulating each computed quotient to predict an amount of life of the battery used up by the load history.

13. The method of claim 1 further comprising:
predicting an accumulated depletion in a capacity related to the battery state, by performing the prediction off-line after the samples have been collected on an industrial vehicle and wirelessly transmitted to a remote server.

14. The method of claim 1 further comprising:
predicting an accumulated depletion in a capacity related to the battery state by performing the prediction on an industrial vehicle on the fly as samples are recorded by a processor of the materials handling vehicle.

15. The method of claim 1 further comprising:
clearing current samples from bins after being wirelessly transmitted to a remote server.

* * * * *

UNITED STATES PATENT AND TRADEMARK OFFICE
CERTIFICATE OF CORRECTION

| | |
|---|---|
| PATENT NO. | : 9,488,697 B2 |
| APPLICATION NO. | : 14/208214 |
| DATED | : November 8, 2016 |
| INVENTOR(S) | : John R. Harman |

It is certified that error appears in the above-identified patent and that said Letters Patent is hereby corrected as shown below:

In the Specification

Column 15, Line 1, "The corresponding structures, material s, acts, and equivalents" should read
-- The corresponding structures, materials, acts, and equivalents --

Signed and Sealed this
Ninth Day of May, 2017

Michelle K. Lee
*Director of the United States Patent and Trademark Office*